US 6,955,968 B2

(12) United States Patent
Forbes et al.

(10) Patent No.: US 6,955,968 B2
(45) Date of Patent: Oct. 18, 2005

(54) GRADED COMPOSITION GATE INSULATORS TO REDUCE TUNNELING BARRIERS IN FLASH MEMORY DEVICES

(75) Inventors: Leonard Forbes, Corvallis, OR (US); Jerome M. Eldridge, Los Gatos, CA (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/610,996

(22) Filed: Jul. 1, 2003

(65) Prior Publication Data

US 2004/0104426 A1 Jun. 3, 2004

Related U.S. Application Data

(62) Division of application No. 09/945,514, filed on Aug. 30, 2001, now Pat. No. 6,586,797.

(51) Int. Cl.[7] .................. H01L 21/8238; H01L 21/336; H01L 21/332
(52) U.S. Cl. ...................... 438/266; 438/770; 438/594; 438/474; 438/264; 438/201; 257/335
(58) Field of Search ............................... 257/314, 315, 257/316, 317, 321, 324, 325; 438/201, 211, 257, 266, 260, 263, 264

(56) References Cited

U.S. PATENT DOCUMENTS

| 5,101,249 A | * | 3/1992 | Hijiya et al. ................. 257/314 |
| 5,530,581 A |   | 6/1996 | Cogan ........................... 359/265 |
| 5,801,401 A |   | 9/1998 | Forbes .......................... 257/77 |
| 5,852,306 A |   | 12/1998 | Forbes ......................... 257/315 |
| 5,886,368 A | * | 3/1999 | Forbes et al. ................. 257/77 |
| 5,981,350 A |   | 11/1999 | Geusic et al. ................ 438/386 |
| 6,025,627 A |   | 2/2000 | Forbes et al. ................ 257/321 |
| 6,031,263 A |   | 2/2000 | Forbes et al. ................ 257/315 |
| 6,249,020 B1 |   | 6/2001 | Forbes et al. ................ 257/315 |
| 6,294,813 B1 |   | 9/2001 | Forbes et al. ................ 257/321 |
| 6,307,775 B1 |   | 10/2001 | Forbes et al. .......... 365/185.01 |
| 6,331,465 B1 |   | 12/2001 | Forbes et al. ............... 438/260 |
| 6,778,441 B2 | * | 8/2004 | Forbes et al. .......... 365/185.26 |

OTHER PUBLICATIONS

"Silicon Monoxide", *CERAC Inc.*, http://www.cerac.com/pubs,(2000),4 pages.

Al–Ani, S. , et al., "The Effect of Temperature on the Optical Absorption Edge of Amorphous Thin Films of Silicon Monoxide", *Phys. Stat. Sol.*, 123(2), (1984),pp. 653–658.

Al–Ani, S. , et al., "The optical absorption edge of amorphous thin films of slicon monoxide", *Journal of Materials Science*, 19, (1984),pp. 1737–1748.

(Continued)

*Primary Examiner*—Nathan J. Flynn
*Assistant Examiner*—Victor A. Mandala, Jr.
(74) *Attorney, Agent, or Firm*—Schwegman, Lundberg, Woessner & Kluth, P.A.

(57) ABSTRACT

Flash memory cells are provided that include a first source/drain region and a second source/drain region separated by a channel region. A first gate opposes. A first gate insulator separates the first gate from the channel. The first gate insulator includes a graded composition gate insulator. A second gate is separated from the first gate insulator by a second gate insulator. The above memory cells produce gate insulators with less charging at the interface between composite insulator layers and provide gate insulators with low surface state densities. The memory cells substantially reduce large barrier heights or energy problems by using dielectrics having suitably, adjustably lower barrier heights in contact with the polysilicon floating gate. Such adjustable barrier heights of controlled thicknesses can be formed using a silicon suboxide and a silicon oxycarbide dielectrics prepared according to the process as described herein.

31 Claims, 7 Drawing Sheets

OTHER PUBLICATIONS

Chand, N., et al., "Tunability of intrinisic stress in SiO/sub x/ dielectric films formed by molecular beam deposition", *Thin Films: Stresses and Mechanical Properties V. Symposium, Material Research Society*, (1995),pp. 195–200.

Demichelis, F., et al., "Doped amorphous and microcrystalline silcon carbide as wide band–gap material", *Wide Band Gap Semiconductors Symposium, Materials Research Society*, Pittsburgh, PA,(1991),pp. 675–680.

Eldridge, J., et al., "Oxidation of Plasma–Deposited a–SixC1–x:H Films", *Journal of Electrochem. Soc., 137(7)*, (1990),pp. 2266–2271.

Farusawa, T., et al., "Simple, Reliable Cu/low–k Interconnect Integration Using Mechanically–strong Low–k Dielectric Material: Silicon–oxycarbide", *IEEE*, (2000),pp. 222–224.

Hirayama, M., et al., "Low–Temperature Growth of High–Integrity Silicon Oxide Films by Oxygen Radical Generated in High–Density Krypton Plasma", *IEEE*, (1999),4 pages.

Ilyas, M., et al., "The optical absorption edge of amorphous thin films of silicon monoxide and of silicon monoxide mixed with titanium monoxide", *Journal of Materials Science Letters, 2(7)*, (1983),pp. 350–352.

Kubaschewski, O., et al., *Oxidation of Metals and Alloys*, Butterworths Press, London,(1962),6 pages.

Renlund, G., et al., "Silicon oxycarbide glasses: Part I. Preparation and chemistry", *Journal of Materials Research, 6(12)*, (1991),pp. 2718–2722.

Renlund, G., et al., "Silicon oxycarbide glasses: Part II. Structure and properties", *Journal of Materials Research, 6(12)*, (1991),pp. 2723–2734.

Robinson, G., "Passivation hardness for low–cost package", *Bell Labs*, Murray Hill, New Jersey,(2001),pp. 1–3.

Shi, Y., et al., "Tunneling Leakage Current in Ultrathin (<4 nm) Nitride/Oxide Stack Dielectrics", *IEEE Electron Device Letters, 19(10)*, (1998),pp. 388–390.

Strass, A., et al., "Fabrication and characterisation of thin low–temperature MBE–compatible silicon oxides of different stoichiometry", *Thin Solid Films, 349*, (1999),pp. 135–146.

Sze, S., *Physics of Semiconductor Devices, Second Edition*, John Wiley & Sons, Inc., New York, (1981),p. 403.

* cited by examiner

GRADED COMPOSITION GATE INSULATORS TO REDUCE TUNNELING BARRIERS IN FLASH MEMORY DEVICES

RELATED APPLICATIONS(s)

This application is a divisional of U.S. patent application Ser. No. 09/945,514 filed Aug. 30, 2001, now U.S. Pat. No. 6,586,797, which is incorporated herein by reference.

FIELD OF THE INVENTION

The present invention relates generally to integrated circuits, and in particular to graded composition gate insulators to reduce tunneling barriers in Flash memory devices.

BACKGROUND OF THE INVENTION

Field-effect transistors (FETs) are typically produced using a standard complementary metal-oxide-semiconductor (CMOS) integrated circuit fabrication process. As is well known in the art, such a process allows a high degree of integration such that a high circuit density can be obtained with the use of relatively few well-established masking and processing steps. A standard CMOS process is typically used to fabricate FETs that each have a gate electrode that is composed of n-type conductively doped polycrystalline silicon (polysilicon) material or other conductive materials.

Field effect transistors (FETs) are used in many different types of memory devices, including EPROM, EEPROM, EAPROM, DRAM and flash memory devices. They are used as both access transistors, and as memory elements in flash memory devices. In these applications, the gate is electrically isolated from other conductive areas of the transistor by an oxide layer. A drawback with FETs having grown oxide insulators is manifested in the use of Fowler-Nordheim tunneling to implement nonvolatile storage devices, such as in electrically erasable and programmable read only memories (EEPROMs). EEPROM memory cells typically use CMOS floating gate FETs. A floating gate FET typically includes a floating (electrically isolated) gate that controls conduction between source and drain regions of the FET. In such memory cells, data is represented by charge transfer on the floating gates. Fowler-Nordheim tunneling is one method that is used to store charge on the floating gates during a write operation and to remove charge from the polysilicon floating gate during an erase operation. The high tunneling voltage of grown oxides used to provide such isolation increases the time needed to store charge on the floating gates during the write operation and the time needed to remove charge from the polysilicon floating gate during the erase operation. This is particularly problematic for "flash" EEPROMs, which have an architecture that allows the simultaneous erasure of many floating gate transistor memory cells. Since more charge must be removed from the many floating gates in a flash EEPROM, even longer erasure times are needed to accomplish this simultaneous erasure. There is a need in the art to obtain floating gate transistors allowing faster storage and erasure, such as for use in flash EEPROMs.

Many gate insulators have been tried, such as grown oxides, CVD (chemical vapor deposition) oxides, and deposited layers of silicon nitride, aluminum oxide, tantalum oxide, and titanium oxide with or without grown oxides underneath. The only commonly used gate insulator at the present time is thermally grown silicon oxide. If other insulators are deposited directly on the silicon, high surface state densities result. Composite layers of different insulators are first grown and then deposited, such as oxide-CVD oxide or oxide-CVD nitride combinations. If composite insulators are used, charging at the interface between the insulators results due to trap states at this interface, a bandgap discontinuity, and/or differences in conductivity of the films.

Silicon dioxide is an insulator with a relative dielectric constant 3.9, energy gap~9 eV, and electron affinity ($\chi$) of 0.9 eV. By comparison, the energy gap and electron affinity for the semiconductor silicon are 1.1 eV and 4.1 eV, respectively. In a conventional flash memory, electrons stored on the polysilicon floating gate see a large tunneling barrier of about 3.2 eV. FIG. 1 shows the conventional large 3.2 eV barrier for tunneling erase in flash memory devices. The current during erase is an exponential function of the barrier height and thickness (S. M. Sze, "Physics of semiconductor devices," Wiley, N.Y., 1981, p. 403). The large 3.2 eV tunneling barrier is the difference between the electron affinities $\chi$ of silicon (4.1 eV) and SiO2 (0.9 eV). See FIG. 4. This is a relative large barrier which requires high applied electric fields for electron injection. Even with high applied fields, the erase times are long. The high fields additionally degrade device yield and contribute to various reliability problems including premature gate insulator breakdowns. Such problems stem from the fact that polysilicon gate conductors in combination with an $SiO_2$ and/or $Si_3N_4$ dielectrics produces a large barrier height for charge injection and thus do not constitute an optimum combination of materials for flash memories.

Other approaches to resolve the above described problems include; the use of different floating gate materials, e.g. SiC, SiOC, GaN, and GaAIN, which exhibit a lower work function (see FIG. 2A), the use of structured surfaces which increase the localized electric fields (see FIG. 2B), and amorphous SiC gate insulators with larger electron affinity, $\chi$, to increase the tunneling probability and reduce erase time (see FIG. 2C).

One example of the use of different floating gate (FIG. 2A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAIN FLOATING GATE," Ser. No. 08/908098, and "VARIABLE ELECTRON AFFINITY DIAMOND-LIKE COMPOUNDS FOR GATES IN SILICON CMOS MEMORIES AND IMAGING DEVICES," Ser. No. 08/903452.

An example of the use of the structured surface approach (FIG. 2B) is provided in U.S. Pat. No. 5,981,350 by J. Geusic, L. Forbes, and K.Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 2C) is provided in U.S. patent application Ser. No. 08/903453 by L. Forbes and K. Ahn, entitled "GATE INSULATOR FOR SILICON INTEGRATED CIRCUIT TECHNOLOGY BY THE CARBURIZATION OF SILICON."

Still, there is a need for other improved gate insulators which provides a low tunneling barrier. There is a further need to reduce the tunneling time to speed up storage and retrieval of data in memory devices. There is yet a further need for a gate insulator with less charging at the interface between composite insulator layers. A further need exists to form gate insulators with low surface state densities.

SUMMARY OF THE INVENTION

The above mentioned problems with semiconductor memories and other problems are addressed by the present invention and will be understood by reading and studying the following specification. Systems and methods are provided which substantially reduce large barrier heights or energy problems by using dielectrics having suitably, adjustably lower barrier heights in contact with the polysilicon floating gate. Such adjustable barrier heights of controlled thicknesses can be formed using $SiO_x$ and $Si_xC_yO_z$ dielectrics prepared according to the process as described herein.

This disclosure describes the use of the lower band gap and larger electron affinity dielectric materials silicon suboxide ($SiO_x$ with 1>x<2) and silicon oxycarbide ($Si_xC_yO_z$) in combination with a $SiO_2$ to form composite dielectric flash memory gate insulators. Such structures will have lower effective tunneling barriers and consequently reduce device erase times, other factors being equal.

In one embodiment of the present invention, a flash memory cell is provided. The flash memory cell includes a first source/drain region and a second source/drain region separated by a channel region. A first gate opposes the channel. A first gate insulator separates the first gate from the channel. The first gate insulator includes a graded composition gate insulator. The graded composition gate insulator, or composite gate dielectric structure has a larger electron affinity insulator on top of a silicon dioxide layer underneath the floating gate to reduce the tunneling barrier during erase. A second gate is separated from the first gate by a second gate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

This disclosure describes the use of the lower band gap and larger electron affinity dielectric materials silicon suboxide ($SiO_x$ with 1>x<2) and silicon oxycarbide ($Si_xC_yO_z$) in combination with a $SiO_2$ to form composite dielectric flash memory gate insulators. Such structures will have lower effective tunneling barriers and consequently reduce device erase times, other factors being equal. According to the teachings of the present invention, if a double dielectric layer structure is used, then that dielectric having a lower barrier will produce a larger tunneling current provided the electric fields and layer thicknesses are comparable. Both insulator materials must have similar dielectric constants so as to keep the electric fields comparable in each layer.

Figure 1:
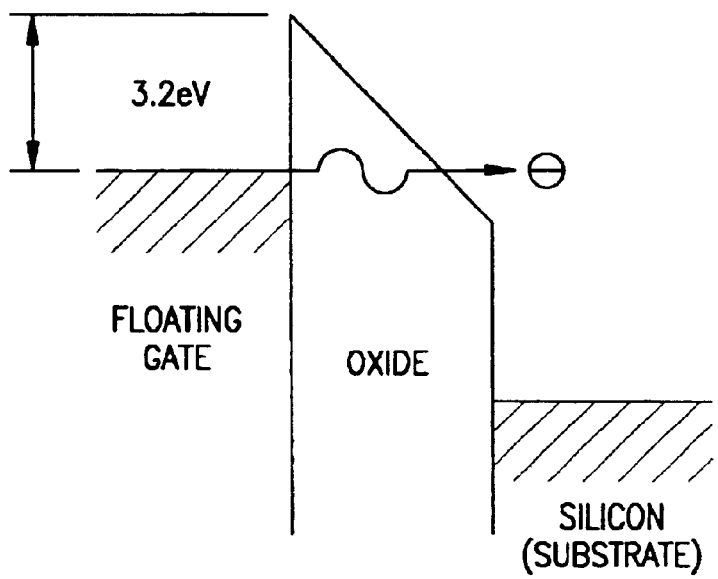
FIG. 1 shows a conventional silicon dioxide ($SiO_2$) insulator separating a floating gate from a substrate for a flash memory device
Figure 2A:
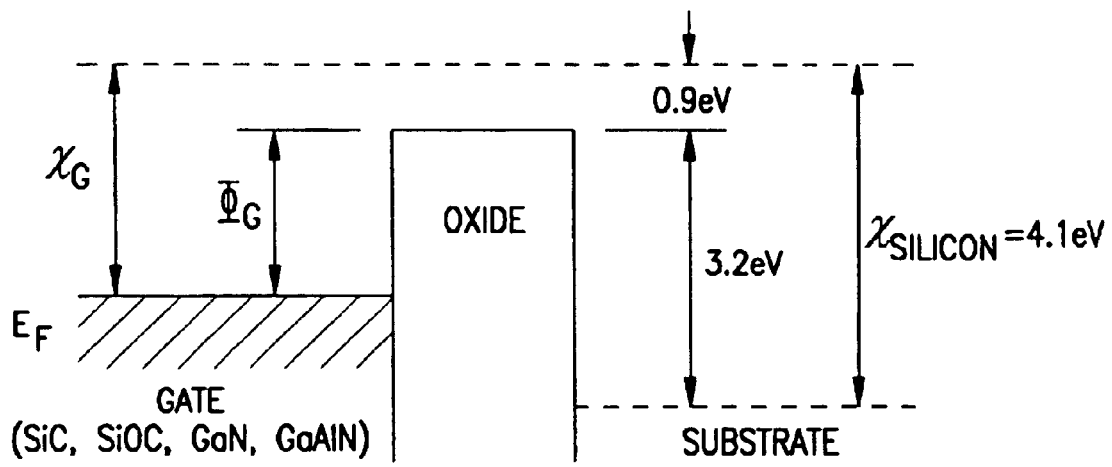
FIGS. 2A–2C illustrate a number of previous methods for reducing tunneling barriers in Flash memory.
Figure 2B:
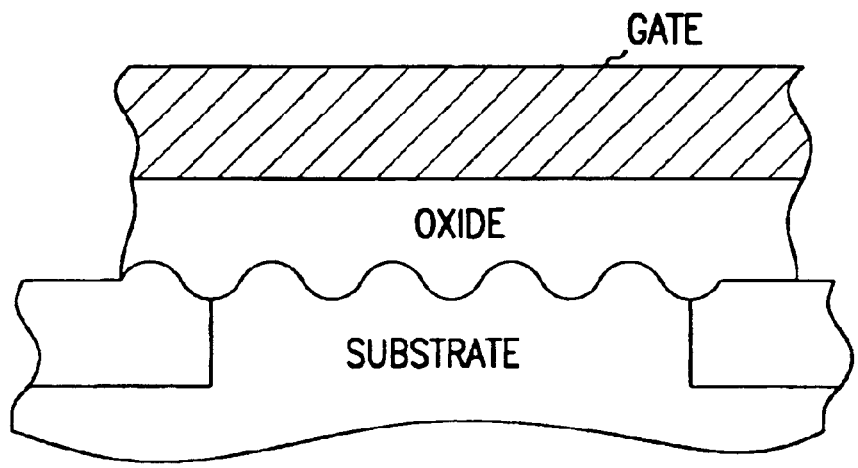
Figure 2C:
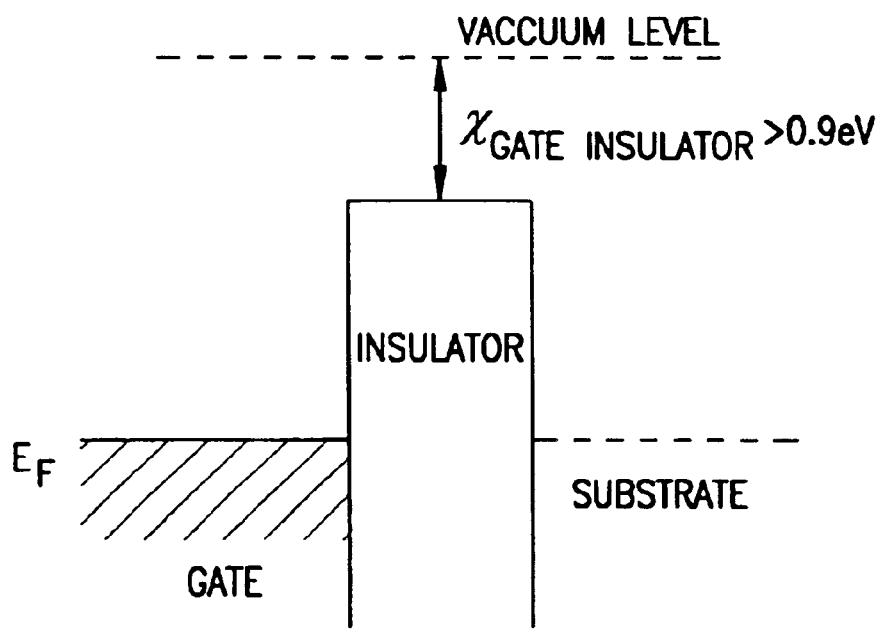
Figure 3:
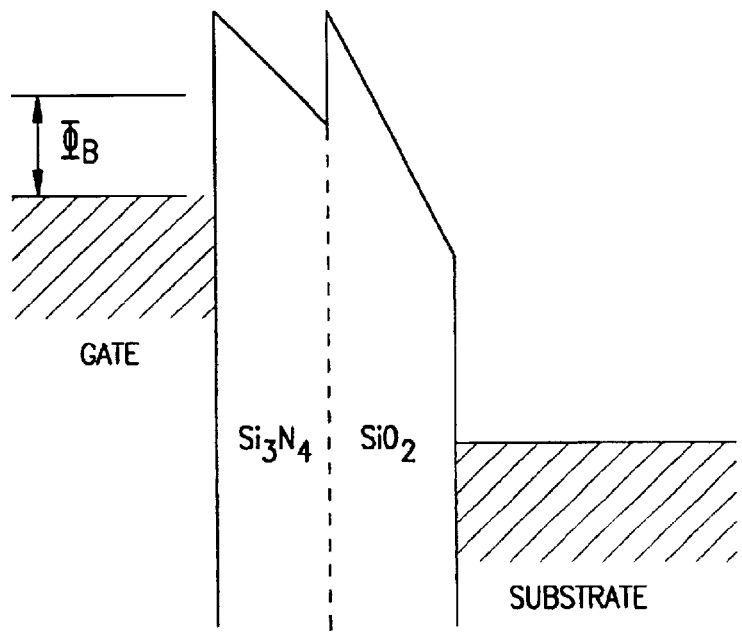
FIG. 3 is an energy band diagrams illustrating the tunneling barrier for an erase operation in a flash memory cell having a higher dielectric constant layer such as $Si_3N_4$ over an insulator such as $SiO_2$ to form a composite gate dielectric structure according to the teachings of the prior art.

FIG. 3 illustrates a polysilicon gate conductor in combination with an SiO2 and/or $Si_3N_4$ dielectric according to the teachings of the prior art for gate insulators. In prior work typically, a higher dielectric constant layer such as $Si_3N_4$ is used over an insulator such as $SiO_2$ to form a composite gate dielectric structure (T. P. Ma et al., "Tunneling leakage current in ultrathin (<4 nm) nitride/oxide stack dielectrics," IEEE Electron Device Letters, vol. 19, no. 10, pp. 388–390, 1998). This structure has been used as the gate insulator of conventional CMOS devices. The larger dielectric constant of silicon nitride reduces the electric fields and reduces tunneling. While this is desirable for conventional devices it is not so here where the objective is to increase tunneling currents.

Figure 4:
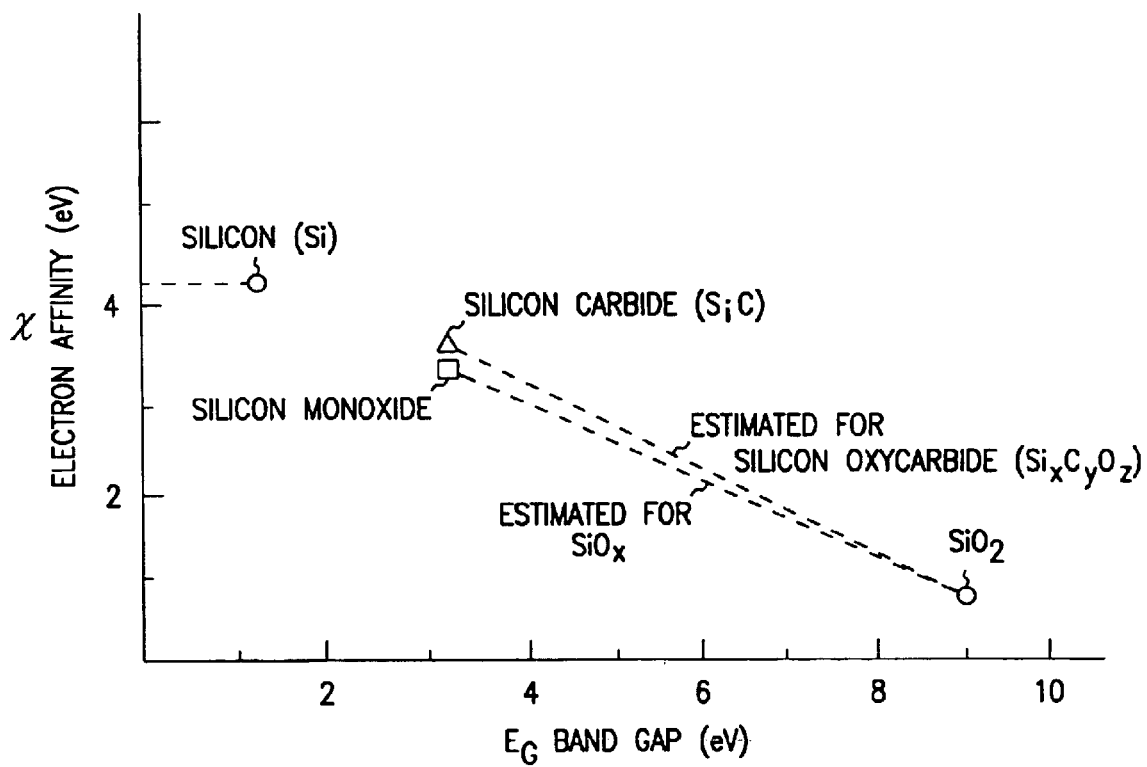
FIG. 4 a graph plotting electron affinity versus band gap energy of silicon, carbide, and oxygen related compounds.

FIG. 4 is a graph plotting electron affinity versus band gap energy of silicon, carbide, and oxygen related compounds. As shown in FIG. 4, silicon dioxide is an insulator with a relative dielectric constant of 3.9, energy gap of approximately 9.0 eV, and electron affinity $\chi$ of 0.9 eV. In a conventional flash memory, electrons stored on the polysilicon floating gate see a large tunneling barrier of about 3.2 eV. This value is the difference between the electron affinities $\chi$ of silicon (4.1 eV) and $SiO_2$ (0.9 eV). This is a relative large barrier which requires high applied electric fields for electron injection. SiO has a dielectric constant close to that of $SiO_2$ which, as stated above, has a value near 3.9. Also, as shown in FIG. 4, SiO has a band gap of approximately 3.2 eV and an estimated electron affinity of 3.5 eV. Accordingly, as shown in FIG. 4, the x in SiOx can be varied to produce a range of electron affinities and poly-Si/a-SiOx tunneling barriers from 0.6 eV to 3.2 eV. Finally, Crystalline SiC has a band gap of ~3 eV and an electron affinity of 3.7 eV. Amorphous SiC or a-SiC and hydrogenated, amorphous a-$SiC_x$:H films have relatively low conductivity under modest applied electric fields (see generally, F. Dimichelis et al., "Doped amorphous and microcrystalline silicon carbide as wide bandgap material," Symp. On Wide Band Gap Semiconductors, Mat. Res. Soc., Pittsburgh, Pa., pp. 675–680, 1992). Amorphous-$Si_xC_yO_z$, or a-$Si_xC_yO_z$, is a wide band gap insulator with a low dielectric constant (<4), comparable to $SiO_2$ (see generally, T. Furusawa et al., "Simple reliable Cu/low-k interconnect integration using mechanically-strong low-k dielectric material: silicon-oxycarbide," Proc. WEEE int. Interconnect Technology Conf., pp. 222–224, Jun. 2000). No measurements have been reported on the electron affinities of amorphous films of silicon oxycarbide but projections can be made based on the electron affinities and band gaps of $SiO_2$ and SiC. As shown in FIG. 4, the electron affinity of a-$Si_xC_yO_z$ should vary from that of silicon dioxide (0.9 eV) to that of the silicon carbide (3.7 eV). This means that the electron barrier between the oxycarbide and silicon (sic, the difference in electron affinities of the pure silicon dioxide and pure silicon carbide) can be varied from roughly 0.4 to 3.2 eV.

Figure 5:
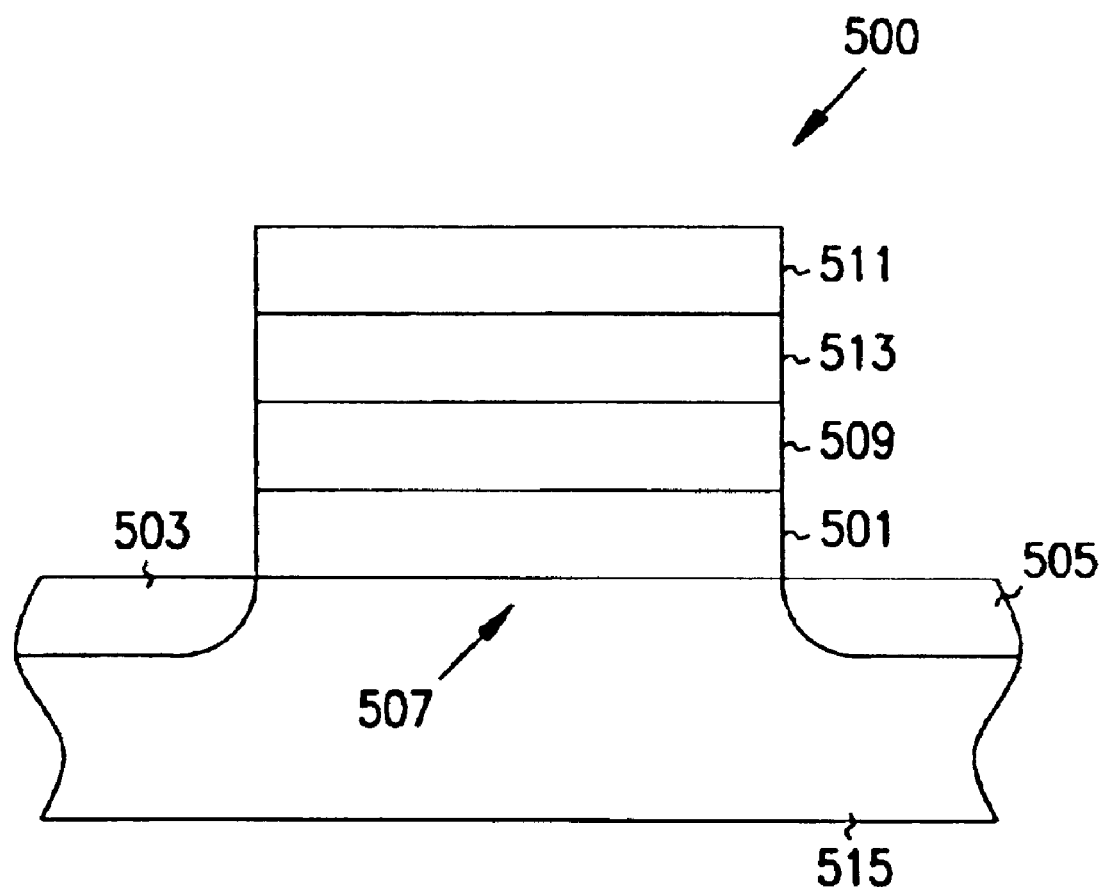
FIG. 5 illustrates a flash memory cell having a graded composition gate insulator to reduce tunneling barriers according to the teachings of the present invention.

FIG. 5 illustrates one embodiment of a flash memory cell 500 having a graded composition gate insulator 501 to reduce tunneling barriers according to the teachings of the present invention. As shown in FIG. 5, the flash memory cell 500 includes a first source/drain region 503 and a second source/drain region 505 separated by a channel region 507. A floating gate 509 is formed opposing the channel 507. A first gate insulator, e.g. the graded composition gate insulator, 501 separates the floating gate 509 from the channel 507. According to the embodiment shown in FIG. 5, the first gate insulator 501 includes a graded composition gate insulator 501 having a low band gap and large electron affinity.

According to the teachings of the present invention, in one embodiment of FIG. 5, the graded composition gate insulator 501 includes a dielectric material having a $SiO_2$ layer in combination with a silicon oxycarbide ($Si_xC_yO_z$) layer to form the graded composition gate insulator 501. According to the teachings of the present invention, the silicon oxycarbide ($Si_xC_yO_z$) layer is formed on top of the $SiO_2$ layer under the floating gate 509.

In an alternative embodiment of FIG. 5, the graded composition gate insulator 501 includes a $SiO_2$ layer in combination with a silicon suboxide ($SiO_x$ with 1<x<2) layer to form the graded composition gate insulator 501. Again, according to the teachings of the present invention, the silicon suboxide ($SiO_x$ with 1<x<2) layer is formed on top of the $SiO_2$ layer under the floating gate 509.

As will be understood by one of ordinary skill in the art upon reading this disclosure, the graded composition gate insulator provides a low electron barrier height ($\Theta_G$) for charge injection. That is in one embodiment, according to the teachings of the present invention, the low electron barrier height of the graded composition gate insulator 501 includes an electron barrier height ranging from 0.6 eV to 3.2 eV.

As shown in FIG. 5, a control gate 511 is separated from the floating gate 509 insulator by a second gate insulator 513. Further, as one of ordinary skill in the art will understand upon reading this disclosure, the channel region 507 and/or substrate material 515 can include silicon and doped silicon materials 515. Likewise, the first gate material 509 can include polysilicon or other silicon gate materials as the same will be known and understood by one of ordinary skill in the art upon reading this disclosure. The invention is not so limited. However, for ease of illustration, the below discussion will assume a channel 507 or substrate 515, and a first gate material 509 comprised of silicon.

FIGS. 6A–6D are energy band diagrams illustrating the tunneling barrier energies for an erase operation in a flash memory cell having a two layer, or graded composition gate insulator formed according to the teachings of the present invention.

The graded composition gate insulator in FIGS. 6A–6D illustrates in greater detail the graded composition gate insulator 501 from FIG. 5. That is, in the energy band diagram of FIGS. 6A–6D illustrate a floating gate 609 separated from a channel region 607 in the substrate by a graded composition gate insulator 601.

As explained above in connection with FIG. 5, one embodiment for the graded composition gate insulator 601 includes a dielectric material having a $SiO_2$ layer 620 in combination with a silicon oxycarbide ($Si_xC_yO_z$) layer 622 to form the graded composition gate insulator 601. According to the teachings of the present invention, the silicon oxycarbide ($Si_xC_yO_z$) layer 622 is formed adjacent to the floating gate 609 and the $SiO_2$ layer 620 is formed adjacent to the channel 607. In an alternative embodiment, the graded composition gate insulator 601 includes a $SiO_2$ layer 620 in combination with a silicon suboxide ($SiO_x$ with 1<x<2) layer 622 to form the graded composition gate insulator 601. Again, according to the teachings of the present invention, the silicon suboxide ($SiO_x$ with 1<x<2) layer 622 is formed adjacent to the floating gate 609 and the $SiO_2$ layer 620 is formed adjacent to the channel 607.

As will be understood by one of ordinary skill in the art upon reading this disclosure, the graded composition gate insulator 601 can be a true graded composition gate insulator 601. However, the invention is not so limited, and as one of ordinary skill in the art will understand upon reading this disclosure, the gate insulator 601 can include two distinct layers, including a first layer dielectric material 620 and a second layer dielectric material 622, separating a first gate material 609 from a channel region or substrate material 607.

As will be understood by one of ordinary skill in the art upon reading and studying this disclosure, the a first layer 620 and the second layer 622 of the graded composition gate insulator, or first gate insulator, 601 have a similar dielectric constant to keep the electric fields comparable in each layer, 620 and 622 respectively. Further, as one of ordinary skill in the art will understand upon reading this disclosure the first gate insulator 601 provides a low electron barrier height for charge injection.

Figure 6A:
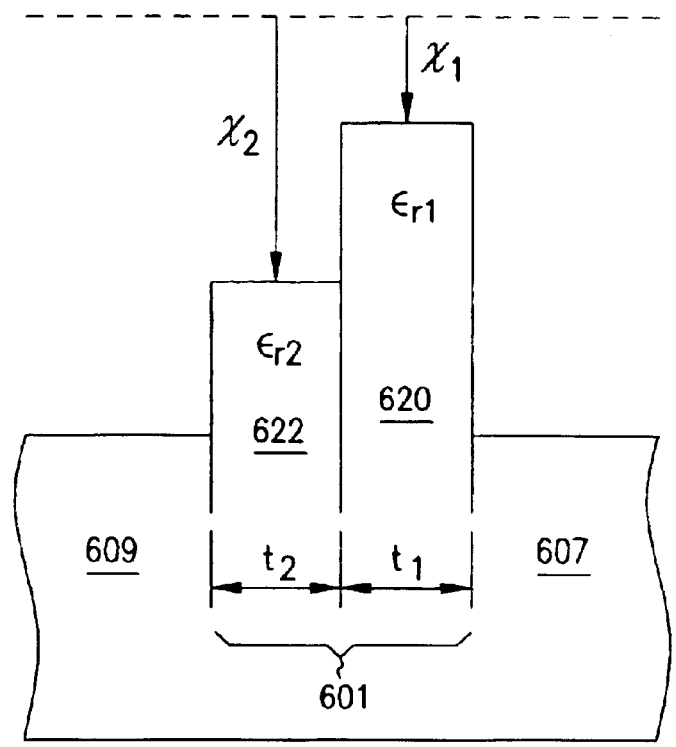
FIGS. 6A and 6D are energy band diagrams illustrating the tunneling barrier energies for an erase operation in a flash memory cell having a two layer, or graded composition gate insulator formed according to the teachings of the present invention.

FIG. 6A illustrates the calculation of the tunneling current with not a graded gate insulator but rather a two layer structure, 620 and 622 respectively. As will be understood by one of ordinary skill in the art upon reading and studying this disclosure, applying a voltage across this composite insulator structure 601 causes the electric fields to be determined by the relative thickness, $t_1$ and $t_2$, and dielectric constants as shown further in FIG. 6B. Guass' law requires that the electric flux be continuous. If the dielectric constants are not too different then the electric fields in both layers will be comparable, as shown in FIG. 6C. For simplicity both layers have been assumed to have the same thickness. However the tunneling current will be determined by the barrier height of the second or top insulator layer 622, e.g. the silicon oxycarbide ($Si_xC_yO_z$) layer 622, or alternatively the silicon suboxide ($SiO_x$ with $1<x<2$) layer 622. Finally, the tunneling current depends exponentially on the barrier as shown in FIG. 6D.

Figure 6B:
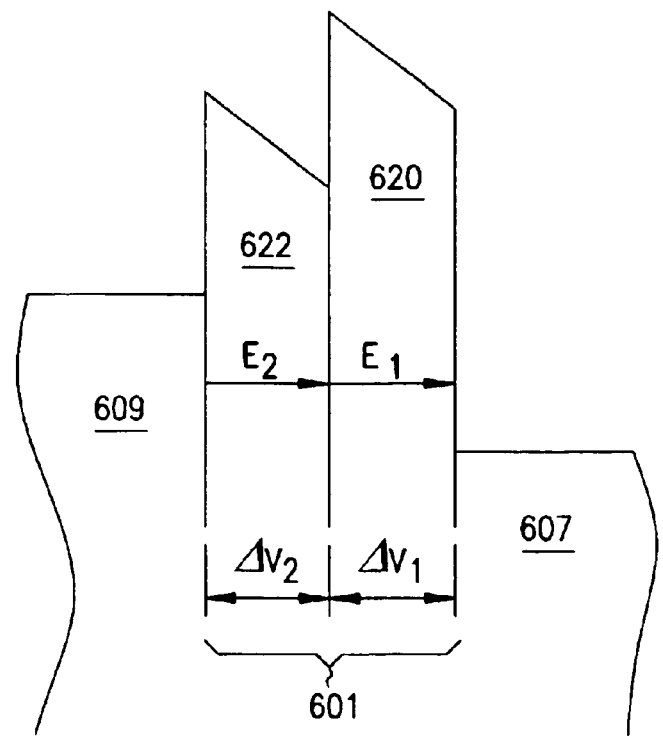
Figure 6C:
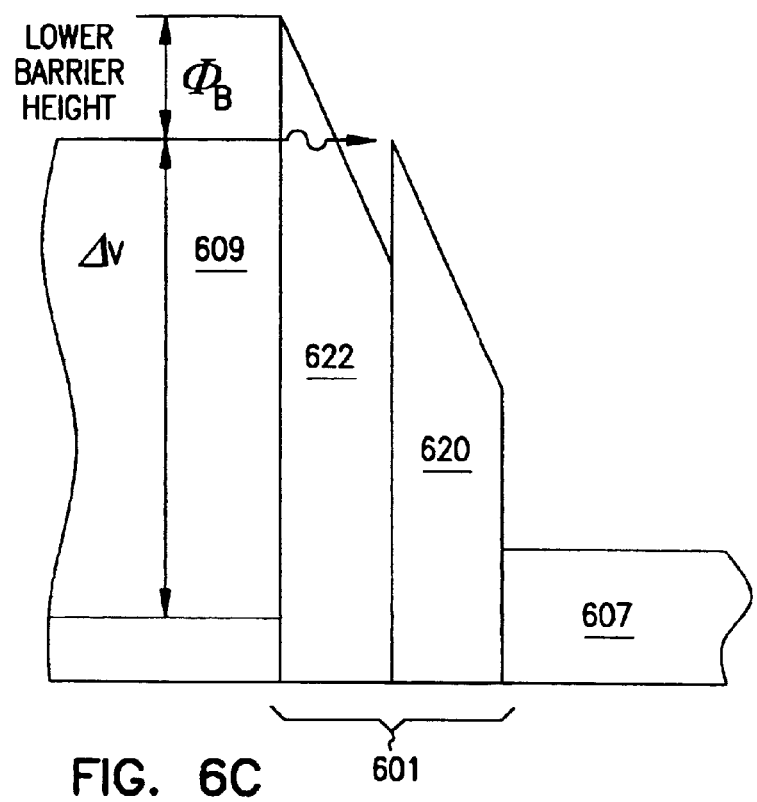
Figure 6D:
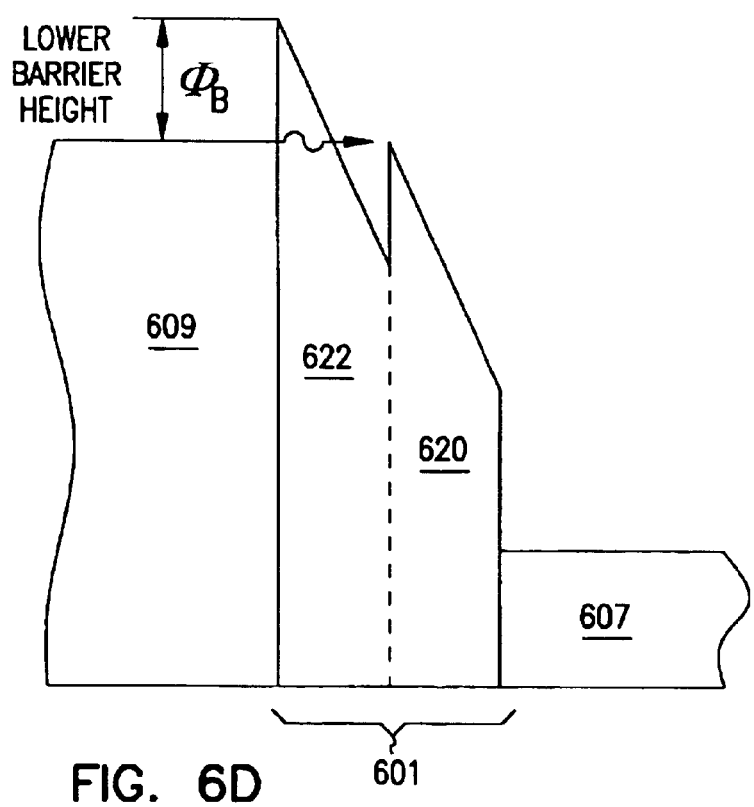

In FIGS. 6A–6B the electric fields and voltages can be expressed or derived as follows:

$$\Delta V_{TOTAL} = \Delta V_1 + \Delta V_2;$$
$$= E_1 t_1 + E_2 t_2;$$
$$E_2 = \frac{\epsilon_{r1} E_1}{\epsilon_{r2}};$$
$$\Delta V = E_1 t_1 + \frac{\epsilon_{r1} E_1 t_2}{\epsilon_{r2}};$$
$$\Delta V = E_1 \left( t_1 + \frac{\epsilon_{r1} t_2}{\epsilon_{r2}} \right);$$

if $t_1 = t_2$ then $$\Delta V = E_1 t_1 \left( 1 + \frac{\epsilon_{r1}}{\epsilon_{r2}} \right);$$

$$E_1(t_1) = \frac{\Delta V}{\left(1 + \frac{\epsilon_{r1}}{\epsilon_{r2}}\right)};$$

$\Delta V_1 E_1 t_1$;
$\Delta V_2 E_2 t_2$; and
$\epsilon_{r2} E_2 = D = \epsilon_{r1} E_1$.

In FIG. 6C the electric field ($E_1$) in the first layer 620 and the electric field ($E_2$) in second layer 622 may be written as:

$$E_1 = \frac{\Delta V}{t_1} \frac{1}{\left(1 + \frac{\epsilon_{r1}}{\epsilon_{r2}}\right)}; \text{ and}$$

$$E_2 = \frac{\Delta V}{t_1} \frac{1}{\left(1 + \frac{\epsilon_{r2}}{\epsilon_{r1}}\right)}.$$

In FIG. 6D the tunneling current may be defined as follows:

$$J \sim E_2 \exp\left[\frac{-4\sqrt{2M*(q\Phi_B)^{\frac{3}{2}}}}{3q\left(\frac{h}{2\pi}\right)E_2}\right]; \text{ and}$$

$$J \sim V^2 e^{\frac{-b}{V}}.$$

Figure 7:
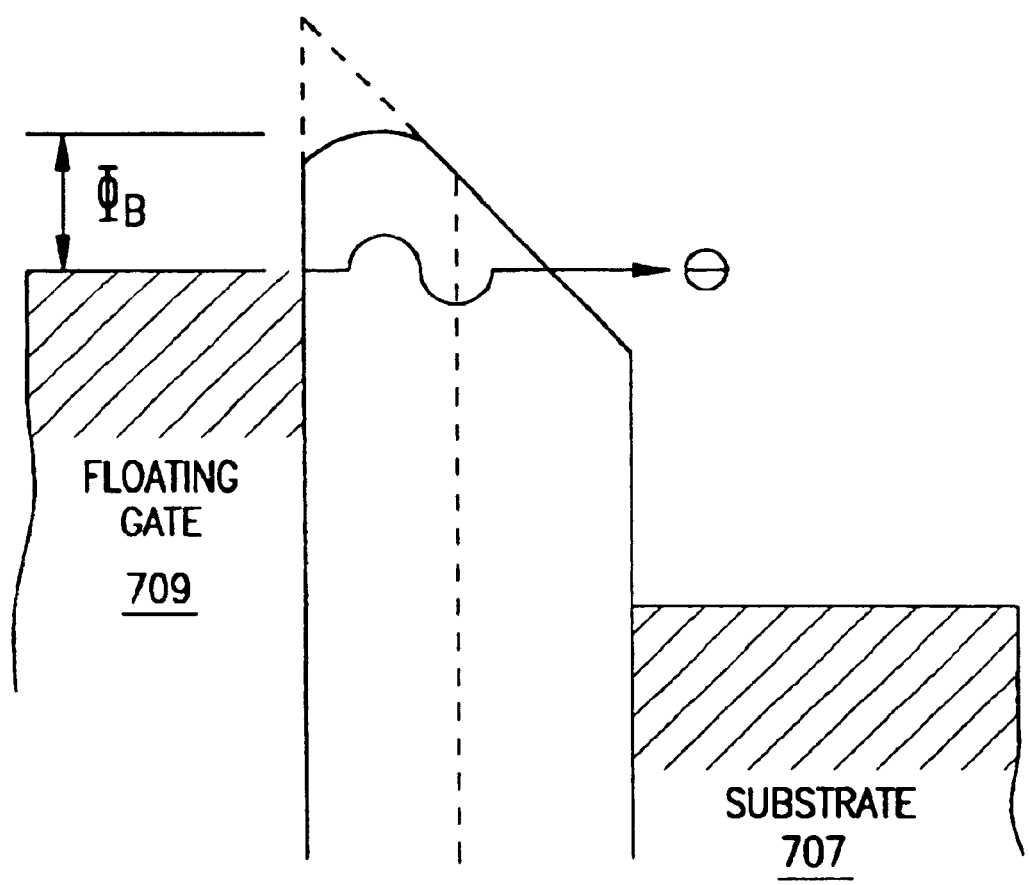
FIG. 7 is an energy band diagram illustrating the tunneling barrier energy for a graded composition gate insulator and gradual change in the electron affinity of the gate insulator material according to the teachings of the present invention.

Thus according to the teachings of the present invention, lower barriers will result in exponentially larger tunneling current and shorter erase times. The preferred device structure is shown in FIG. 7 with a graded composition and gradual change in the electron affinity of the gate insulator material. FIGS. 6A–6D, showing a more distinct two layer structure, has been used to illustrate in more detail how the tunneling currents would increase.

a-$Si_xC_{yz}$ Films

As noted above, in one embodiment of the present invention the second layer 622 of the dielectric material 601 is formed of silicon oxycarbide ($Si_xC_yO_z$). For purposes of the invention, greater detail relating to the silicon oxycarbide ($Si_xC_yO_z$) layer 622 and its method of formation is provided as follows.

Crystalline SiC has a band gap of ~3 eV and an electron affinity of 3.7 eV. (See FIG. 4). Amorphous SiC or a-SiC and hydrogenated, amorphous a-$SiC_x$:H films have relatively low conductivity under modest applied electric fields (see generally, F. Dimichelis et al., "Doped amorphous and microcrystalline silicon carbide as wide bandgap material," Symp. On Wide Band Gap Semiconductors, Mat. Res. Soc., Pittsburgh, Pa., pp. 675–680, 1992). Amorphous-$Si_xC_yO_z$, or a-$Si_xC_yO_z$, is a wide band gap insulator with a low dielectric constant (<4), comparable to $SiO_2$ (see generally, T. Furusawa et al., "Simple reliable Cu/low-k interconnect integration using mechanically-strong low-k dielectric material: silicon oxycarbide," Proc. IEEE int. Interconnect Technology Conf., pp. 222–224, Jun. 2000). No measurements have been reported on the electron affinities of amorphous films of silicon oxycarbide but projections can be made based on the electron affinities and band gaps of $SiO_2$ and SiC. As shown in FIG. 4, the electron affinity of a-$Si_xC_yO_z$ should vary from that of silicon dioxide (0.9 eV) to that of the silicon carbide (3.7 eV). This means that the electron barrier between the oxycarbide and silicon (sic, the difference in electron affinities of the pure silicon dioxide and pure silicon carbide) can be varied from roughly 0.4 to 3.2 eV. Thus, according to one embodiment of the present invention, very thin films of silicon oxycarbide are used over $SiO_2$ films to form the gate insulators, such as gate insulator 501 in FIG. 5, silicon-based CMOS devices.

As further background, it is known that bulk a-$Si_xC_yO_z$:H glasses can be obtained by high temperature pyrolysis, e.g. 1400–1650 C. of methyl trichlorosilame and similar polymers (see generally, G. M. Renlund et al., "Silicon oxycarbide glasses, I. Preparation and chemistry," J. Materials Research, Vol. t, No. 12, pp. 2716–22, Dec. 1991; and G. M. Renlund et al., "Silicon oxycarbide glasses, II. Structure and properties," J. Materials Research, Vol. 6, No. 12, pp. 2723–34, Dec. 1991). Also, relatively thick films, e.g. >3,000 angstroms, of a-$Si_xC_yO_z$:H of limitedly quantified compositions and properties have been made by PECVD at temperatures of 100C. (see generally, S. F. Cogan, "Protective Overlay Material and Electro-Optical Coating Using Same." U.S. Pat. No. 5,530,581, Jun. 25, 1996). However, such thicknesses are impractical for the applications discussed herein. Further, attempts to make a-$Si_xC_yO_z$ films via thermal oxidation of a-$SiC_x$:H and SiC films at temperatures from 500 to 900 C were unsuccessful because carbon in the carbide zone undergoing oxidation does not remain in that zone. Instead, it diffuses through a growing surface oxide layer to the free surface, reacts with oxygen and is removed as carbon monoxide or dioxide, leaving behind a surface layer of virtually pure $SiO_2$ (see generally, J. M. Eldrige, J. O. Moore, G. Olive and V. Dunton, "Oxidation of Plasma-Deposited a-$Si_xC_yO_z$:H Films", J. Electrochem. Soc., Vol. 137, No. 7, pp. 2266–2271 (1990). This behavior can be attributed to the very fast diffusion of carbon atoms through the oxide at these elevated temperatures. Exposure to air for even a short time at room temperature is sufficient to convert the top monolayer or two of a-$Si_xC_yO_z$ and a-SiC films to $SiO_2$.

According to the teachings of the present invention, a more practical approach to oxidize ultra-thin films of a-SiC of precisely controllable thickness to form ultra-thin, a-$Si_xC_yO_z$ films of equally controlled thickness and composition is provided. That is, according to the teachings of the present invention, a-SiC of precisely controllable thickness to form ultra-thin, a-$Si_xC_yO_z$ films of equally controlled thickness and composition is achieved by conducting an oxidation step at relatively low temperatures, e.g. 25 to 200 C. At such temperatures, thermal diffusion processes are much slower. Instead, the motion of electrically charged reactants is driven by the presence of a field that develops across the ultra-thin, growing oxide layer. This field arises from electronegativity differences between adsorbed surface oxygen and the unoxidized material, in accord with the well-known Mott-Cabrera (or, similar) mechanisms. For a filler explanation of low temperature oxidation mechanisms, see generally, O. Kubaschewski and B. E. Hopkins, "Oxidation of Metals and Alloys", Butterworths Press (London), 1962. The mobility of carbon atoms is greatly reduced at such low temperatures so that it remains in place to become part of the growing Si-C-O glassy network. Kubaschewski and Evans have reported similar carbon retention and loss differences due to low and high temperature oxidation, respectively, of various metal carbides.

According to the teachings of the present invention, the oxide thickness will be perhaps 50% thicker than that of the a-SiC consumed, depending on the composition of the silicon oxycarbide layer formed. This, in turn, will depend on the oxidation process parameters and whether one uses molecular oxygen or an oxygen plasma as the reactive gas. Advances in sputtering technology permit the deposition of ultra-thin films to be controlled to within ~1 angstrom. Thus the thickness of the sputter-deposited SiC and the a-$Si_xC_yO_z$ tunnel barrier can be controlled to that level as well. This excellent level of thickness control is an important key to the successful implementation of the present invention.

Processes for Forming SiO2/a-$Si_xC_yO_z$ Composite Dielectrics

Based on the above and in order to avoid redundancies, the following outline is given of as an illustrative example of a number of suitable ways to form this duplex dielectric structure according to the teachings of the present invention. The invention, however, is not so limited and other suitable techniques will be apparent to one of ordinary skill in the art upon reading this disclosure.

To begin with and owing to the strong tendency of carbon to volatilize as CO and/or CO2, the formation of a-$Si_xC_yO_z$ does not use a Temporal or a Spatial Approach as will be discussed below in connection with the silicon suboxide layer embodiment. The basic problem is that reactions of carbides, etc., with oxygen or water very quickly produced volatile oxides of carbon. It is much better to utilize the unique characteristics of Mott-Cabrera oxidation kinetics and their operability near room temperature to freeze lattice carbon in place while allowing a gradual infusion of oxygen into the growing a-$Si_xC_yO_z$ layer. Accordingly the best approach for forming the amorphous oxycarbide layer is to deposit and properly oxidize a $Si_xC_y$ layer of highly controlled thickness. As noted above and used commercially for several years now to control Magnetic Spin Valve Read/Write heads, the thicknesses of various metals (such as copper, permalloy, etc.) can be controlled to within 1 angstrom using current manufacturable processes. Again, as noted above, such oxidations can be accomplished at temperatures <300 C for producing oxide films less than 50 to 100 angstroms in thickness. Such oxidation kinetics can be achieved using either thermal or plasma oxidation. It is essential, however, to minimize the oxidation temperature in order to keep the carbon atoms within the growing oxycarbide layer. The composition and growth rate of the resultant a-$Si_xC_yO_z$ can be adjusted by temperature as well as the pressure of oxygen or its plasma.

SiOx Films (1<x<2)

As noted above, in one embodiment of the present invention the second layer 622 of the dielectric material 601 is formed of silicon suboxide ($SiO_x$ with 1<x<2). For purposes of the invention, greater detail relating to the silicon suboxide ($SiO_x$ with 1<x<2) layer 622 and its method of formation is provided as follows.

Silicon monoxide (SiO) is a compound that is strictly only thermodynamically stable in its vapor phase at elevated temperatures, e.g. >1000 C. When quenched from the vapor phase, it forms SiO glassy films that are widely used for passivating, optical and insulating applications. This oxide composition can be easily deposited, for example, from a thermally or E-beam heated target of high purity SiO under a vacuum of $2\times10^{-6}$ Torr onto substrates held at 100 to 150 C. (See, for example, "Silicon Monoxide", a technical publication of Cerac, Inc. available at www.cerac.coni/pubs.; G. Robinson, "Passivation Hardens Lasers for Low-Cost Package", Bell Labs). In bulk form, SiO is stable near room temperature but disproportionates to form micro-crystalline volumes of Si and $SiO_2$ upon heating to 400 to 800 C.

Relatively thick SiOx films of controllable x can be formed by processes that essentially involve the deposition and reaction of evaporated or sputtered silicon on a substrate in the presence of oxygen in its molecular or plasma states. The $SiO_X$ compositions are determined by the mean free paths of the Si and oxygen moieties which depend upon such factors as the geometry of the deposition system, gas pressure, plasma potentials, etc. Such processes can be tuned to produce $SiO_X$ films of controlled x and having useful optical, passivating and mechanical properties (see generally, N. Hand, R. R. Kola, J. W. Osenbach and W. T. Tsang, "Tanability of Intrinsic Stress in SiOx Dielectric Films Formed by Molecular Beam Deposition", Symposium sponsored by the Materials Research Society on "Thin Films: Stresses and Mechanical Properties", pp. 195–200, (1994)). However, such simple processes do not produce $SiO_X$ film that have the properties requisite to the demands of the present disclosure. This is evident from the results of a comprehensive investigation of SiOx deposition processes and resultant film properties by Strass and co-workers (see generally, A. Strass, et al., "Fabrication and Characterization of Thin Low-Temperature MBE-Compatible Silicon Oxides of Different Stoichiometry", Thin Sold Films, Vol. 136, pp. 135–146 (1999)). They investigated thin, low-temperature MBE-compatible SiOx films grown at low (350C.) temperatures, using a Modular UHV multichamber system (MUM 545 from Blazers) with a base pressure of $5\times10^{-9}$ mbar. These authors explored three different processes:

Method 1. Reactive Si deposition in a low pressure oxygen ambient.

Method II. Reactive deposition of Si in an oxygen plasma.

Method III. Oxidation of a silicon surface immersed in an oxygen plasma. While these methods have been frequently used by other investigators, the study by Strass et al is particularly useful in that all processes were carried out in the same system, thus allowing much better comparisons of film qualities. More importantly and unlike others, they employed a wide range of complementary techniques to extensively characterize the compositional, electrical and optical properties of their films. These techniques included: ellipsometry; profilometry; Auger Electron Spectroscopy;

X-ray Photoelectron Spectroscopy; Rutherford Backscattering; Fourier Transform Infrared Spectroscopy; and, I-V, C-V and G-V measurements on MOS test structures.

In brief, they determined that Method I yielded excellent control over x but the electrical properties of their $SiO_x$ films were quite inferior due to porosity, very high surface and fixed charge states, high leakage levels, etc. These findings point to the conclusion that $SiO_x$ films made by MBE (such as described in N. Hand, R. R. Kola, J. W. Osenbach and W. T. Tsang, "Tunability of Intrinsic Stress in SiOx Dielectric Films Formed by Molecular Beam Deposition", Symposium sponsored by the Materials Research Society on "Thin Films: Stresses and Mechanical Properties", pp. 195–200, (1994)) must be wholly inadequate for use as part of a gate insulator.

In contrast, the Method m approach yielded only $SiO_2$ films with quite attractive electrical properties including: high breakdown strengths, low electrical leakage and reproducible levels of fixed oxide charge. These particular findings are in accord with those of Hirayama et al (see generally, M. Hirayama at al., "Low Temperature Growth of High Integrity Silicon Films by Oxygen Radical Generated in High-Density Krypton Plasmas", IEEE (1999)) who investigated the stoichiometry and electrical properties of silicon oxide films formed at 400 C in various microwave excited plasmas of $Kr/O_2$. Such $SiO_2$ films are not useful then for forming the reduced tunneling barriers of the present invention.

Finally, Method II produced reasonably attractive films with characteristics between those from Methods I and II. For example, films made by Method II have controllable x values. Additionally, the electrical properties of Method II approached the high quality of those achieved by Method III. In Method II, the $SiO_x$ films grow by oxidation of the adsorbed Si on the surface as well as by diffusion of atomic O into the film. At the beginning of oxide growth, the interface is buried below the original substrate surface by diffusion of atomic O. (This is known as subcutaneous oxidation and is vitally important in minimalizing impurities and various interface states when thermally oxidizing silicon to form stoichiometric $SiO_2$ insulators.) When the oxide becomes thicker, it is more likely that dangling bonds of Si rich nano-clusters in the deposited layer serve as a sink for O radicals. Then, fewer O species reach the surface. In a word, subcutaneous oxidation is reduced with increasing film growth and with increasing Si content in the deposited film. Based on the arguments of Strass et al, subcutaneous oxidation should still be dominant in forming ultra-thin, tunneling $SiO_x$ films by Method II. This is quite desirable for the present disclosure since it will further reduce surface states and leakage, relative to those found for much thicker $SiO_x$ films formed via Method II.

Processes for Forming $SiO_2/SiO_x$ Composite Dielectrics

Based on the above information, several ways can be used to form such duplex dielectric structures. The overall processes are only generally described since those skilled in the art can introduce numerous minor variations in order to implement this invention. Two approaches are outlined here wherein the basic intent is to better separate the Si deposition and the plasma oxidation processes, either temporally or spatially. Such separations will lessen unwanted gas phase collisions and reactions, improve film uniformity and reduce fixed charges in the $SiO_x$. Quite importantly, it offers greater control and latitude for optimizing the deposition and oxidation parameters. For example, it could allow for the use of two different pressures in the processing system. Most importantly, it will allow the deposition of silicon to be controlled to within an angstrom or so, using current sputtering or evaporation technologies. This is critical since that thickness will then determine the thickness of the resultant SiOx layer. (Remember that the injected current decreases logarithmically with increasing dielectric thickness, independent of barrier height and all other parameters being equal.) In both approaches, multiple depositions and oxidations would be used to achieve the desired $SiO_x$ thickness and composition.

Temporal Approach

This would involve alternately depositing and oxidizing Si by sequentially activating the Si source (e.g., an S-gun) followed by igniting the plasma. The duration and numbers of deposition and oxidation sequences would be sufficient to form the desired $SiO_x$ composition and thickness. This approach might well be best implemented using a single-wafer vacuum system.

Spacial Approach

As an example of the spacial approach, several Si substrates would be mounted on a plate which rotates in a plane around a central axis. Directed beams of Si would be deposited on wafers passing Position A to form an ultra-thin Si layer. On being then rotated to Position B, this ultra-thin Si layer would be oxidized using a directed beam of oxygen ions and radicals. It would then continue back to Position A for more Si and then on to Position B for oxidation, etc., subs would be deposited on the wafer at Position A. Plasma oxidation of this Si film would be done subsequently at Position B. Specially ground and bias shields can be configured by those knowledgeable in the area for the purpose of confining the oxidizing plasma to the wafer surface exposed at Position B.

With the above in mind, the desired double dielectric structure could be formed following the following general guidelines:

a. In a separate oxidation system, grow a thermal $SiO_2$ layer of desired thickness on the single crystal Si device substrate. This thickness plus that of the second $SiO_x$ layer to be added should permit adequate tunneling to the floating gate under the electric field that will be employed. When this first $SiO_2$ layer is grown in a separate oxidation system, its surface should be very lightly cleaned via sputter etching using inert gas ions in order to remove carbon, water and other surface contaminants acquired during ambient exposure.

b. Alternately, the Si substrate can be oxidized to the desired thickness using an oxygen plasma. This may be less desirable than some applications in view of the slightly higher levels of fixed charge present in such oxides (See, for example, "Silicon Monoxide", a technical publication of Cerac, Inc. available at www.cerac.com/pubs.).

c. Transfer the thermally oxidized wafer to the SiOx processing system and raise its temperature to perhaps 300 to 500 C.

d. Deposit Si from a directed source such as a shielded S-gun or Knudsen cell and oxidize in an oxygen plasma or beam, using either the Spacial or Temporal Approach.

e. The outer monolayer or so of the $SiO_x$ thus formed will be converted to SiO2 when exposed to ambient air. Thus it may be desirable to add a portion of the poly-Si gate layer at this time in order to passivate the surface of the $SiO_x$, before removing the wafers from the processing system. This step will produce a more reproducible $SiO_x/Si$ barrier height and conveniently makes use of the unique features of the processing system. The remainder of the poly-Si gate can be added along with a suitable dopant later.

CONCLUSION

The above structures and fabrication methods have been described, by way of example and not by way of limitation, with respect to provide improved techniques for reduce the tunneling time to speed up storage and retrieval of data in memory devices. The above structures produce gate insulators with less charging at the interface between composite insulator layers and provide gate insulators with low surface state densities. Systems and methods are provided which substantially reduce large barriers heights or energy problems by using dielectrics having suitably, adjustably lower barrier heights in contact with the polysilicon floating gate. Such adjustable barrier heights of controlled thicknesses can be formed using $SiO_x$ and $Si_xC_yO_z$ dielectrics prepared according to the process as described herein.

What is claimed is:

1. A method of forming a flash memory cell, comprising:
   forming a first source/drain region and a second source/drain region separated by a channel region;
   forming a first gate opposing the channel;
   forming a first gate insulator separating the first gate from the channel, wherein forming the gate insulator includes forming a graded composition gate insulator such that the graded composition gate insulator provides a low electron barrier height ranging from 0.4 eV to 3.2 eV; and
   forming a second gate separated from the first gate by a second gate insulator.

2. The method of claim 1, wherein forming the first gate insulator includes forming a low band gap and large electron affinity dielectric material having a silicon suboxide ($SiO_x$ with 1<x<2) layer in combination with a SiO2 layer to form the graded composition gate insulator.

3. The method of claim 2, wherein the method includes forming the silicon suboxide layer on top of the $SiO_2$ layer under the floating gate.

4. The method of claim 1, wherein forming the first gate insulator includes forming a low band gap and large electron affinity dielectric material having a silicon oxycarbide layer in combination with a $SiO_2$ layer to form the graded composition gate insulator.

5. The method of claim 4, wherein the method includes forming the silicon oxycarbide layer on top of the $SiO_2$ layer under the floating gate.

6. A method for forming a flash memory cell, comprising:
   forming a first source/drain region and a second source/drain region separated by a channel region;
   forming a first gate opposing the channel;
   forming a first gate insulator having two layers separating the first gate from the channel, wherein forming the first gate insulator includes forming a first layer and forming a second layer to have a similar dielectric constant in order to keep the electric fields comparable in each layer, and wherein forming the first gate insulator includes forming a first gate insulator to have a low electron barrier height approximately between 0.4 eV to 3.2 eV for charge injection; and
   forming a second gate separated from the first gate by a second gate insulator.

7. The method of claim 6, wherein forming the first gate insulator having two layers includes forming a first layer of $SiO_2$ and forming a second layer of silicon suboxide ($SiO_x$ with 1<x<2).

8. The method of claim 6, wherein forming the first gate insulator having two layers includes forming a first layer of $SiO_2$ and forming the second layer of silicon oxycarbide.

9. The method of claim 6, wherein forming the silicon oxycarbide layer includes forming the silicon oxycarbide layer on top of the $SiO_2$ layer underneath the first gate.

10. The method of claim 6, wherein forming the first gate includes forming a floating gate and wherein forming the second gate includes forming a control gate.

11. A method of forming a flash memory cell, comprising:
    forming a first source/drain region and a second source/drain region separated by a channel region;
    forming a floating gate opposing the channel;
    forming a first gate insulator separating the floating gate from the channel, wherein the first gate insulator includes forming a graded composition gate insulator having a low band gap of approximately 3.2 eV to 3.5 eV and large electron affinity with a range approximately between 0.6 eV and 3.2 eV, and wherein forming the graded composition gate insulator includes forming a dielectric material having a silicon suboxide ($SiO_x$ with 1<x<2) layer in combination with a $SiO_2$ layer to form the graded composition gate insulator; and
    forming a control gate separated from the floating gate insulator by a second gate insulator.

12. A method for forming a flash memory cell, comprising:
    forming a first source/drain region and a second source/drain region separated by a channel region;
    forming a floating gate opposing the channel;
    forming a first gate insulator separating the floating gate from the channel, wherein forming the gate insulator includes forming a graded composition gate insulator having a low band a of approximately 3.2 eV to 3.5 eV and large electron affinity with an approximate range between 0.6 eV and 3.2 eV, and wherein forming the graded composition gate insulator includes forming a dielectric material having a silicon oxycarbide layer in combination with a $SiO_2$ layer to form the graded composition gate insulator; and
    forming a control gate separated from the floating gate insulator by a second gate insulator.

13. The method of claim 12, wherein forming the dielectric material having silicon oxycarbide layer in combination with a $SiO_2$ layer includes forming the silicon oxycarbide layer on top of the $SiO_2$ layer under the floating gate.

14. The method of claim 12, wherein forming the silicon oxycarbide layer includes sputter-depositing an ultra thin amorphous SiC film on silicon substrate wafer and oxidizing the ultra thin film of amorphous SiC at a temperature of between 25 to 200 degrees Celsius such that the motion of electrically charged reactants is driven by the presence of a field that develops across the ultra thin, growing oxide layer.

15. A method for forming a flash memory cell, comprising:
    forming a first source/drain region and a second source/drain region separated by a channel region;
    forming a first gate opposing the channel;
    forming a first gate insulator having two layers including:
       forming a first layer of $SiO_2$ and forming a second layer of silicon suboxide ($SiO_x$ with 1<x<2);
       forming the silicon suboxide layer on top of the $SiO_2$ layer and underneath the first gate; and
       separating the first gate from the channel, and wherein forming the first gate insulator includes forming a first layer and forming a second layer to have a similar dielectric constant in order to keep the electric fields comparable in each layer, and wherein forming the first gate insulator includes forming a first gate insulator to have a low electron barrier height approximately between 0.4 eV to 3.2 eV for charge injection; and forming a second gate separated from the first gate by a second gate insulator.

16. A method of forming a flash memory cell, comprising:
forming a first source/drain region and a second source/drain region separated by a channel region;
forming a floating gate opposing the channel;
forming a first gate insulator separating the floating gate from the channel, wherein the first gate insulator includes forming a graded composition gate insulator having a low band gap of approximately 3.2 eV to 3.5 eV and large electron affinity with a range approximately between 0.6 eV and 3.2 eV, and wherein forming the graded composition gate insulator includes forming a dielectric material having a silicon suboxide ($SiO_x$ with $1<x<2$) layer in combination with a $SiO_2$ layer to form the graded composition gate insulator;
forming a control gate separated from the floating gate insulator by a second gate insulator; and
forming the silicon suboxide layer on top of the $SiO_2$ layer under the floating gate.

17. A method of forming a flash memory cell, comprising:
forming a first source/drain region and a second source/drain region separated by a channel region;
forming a floating gate opposing the channel;
forming a first gate insulator separating the floating gate from the channel, wherein the first gate insulator includes forming a graded composition gate insulator having a low band gap of approximate y 3.2 eV to 3.5 eV and large electron affinity with a range approximately between 0.6 eV and 3.2 eV and an electron barrier height ranging from 0.6 eV to 3.2 eV, and wherein forming the graded composition gate insulator includes forming a dielectric material having a silicon suboxide ($SiO_x$ with $1<x<2$) layer in combination with a $SiO_2$ layer to form the graded composition gate insulator; and
forming a control gate separated from the floating gate insulator by a second gate insulator.

18. A method of forming a flash memory cell, comprising:
forming a first source/drain region and a second source/drain region separated by a channel region;
forming a floating gate opposing the channel;
forming a first gate insulator separating the floating gate from the channel, wherein the first gate insulator includes forming a graded composition gate insulator having a low band gap of approximately 3.2 eV to 3.5 eV and large electron affinity with a range approximately between 0.6 eV and 3.2 eV, and wherein forming the graded composition gate insulator includes forming a dielectric material having a silicon suboxide ($SiO_x$ with $1<x<2$) layer in combination with a $SiO_2$ layer to form the graded composition gate insulator, wherein forming the silicon suboxide layer includes forming the silicon suboxide layer by reactive deposition of Si in an oxygen plasma; and
forming a control gate separated from the floating gate insulator by a second gate insulator.

19. The method of claim 18, wherein the method includes a temporal separation of a silicon deposition process from plasma oxidation process in order to lessen unwanted gas phase collisions and reactions, improve film uniformity and reduce fixed charges in the $SiO_x$.

20. The method of claim 19, wherein the temporal separation of the silicon deposition process from the plasma oxidation process allows the silicon deposition to be controlled to within a few angstroms using sputtering or evaporation technologies.

21. The method of claim 20, wherein the temporal separation of the silicon deposition process from the plasma oxidation process is implemented using a single-wafer vacuum system.

22. The method of claim 18, wherein the method includes a spacial separation of a silicon deposition process from a plasma oxidation process in order to lessen unwanted gas phase collisions and reactions, improve film uniformity and reduce fixed charges in the $SiO_x$.

23. The method of claim 22, wherein the spacial separation of the silicon deposition process from the plasma oxidation process includes:
mounting several Si substrates wafers on a plate which rotates in a plane around a central axis;
depositing Si on the wafers using directed beams as each wafer passes a first position to form an ultra thin Si layer; and
oxidizing the ultra thin Si layer using a directed beam of oxygen ions and radicals as each wafer is rotate to a second position.

24. The method of claim 23, wherein the method further includes repeating the deposition and oxidizing by rotating the wafers back through the first and second positions.

25. The method of claim 24, wherein the method further includes using ground and bias shields for confining the oxidizing plasma to only wafer surfaces exposed in the second position.

26. The method of claim 18, wherein forming a dielectric material having a silicon suboxide ($SiO_x$ with $1<x<2$) layer in combination with an $SiO_2$ layer to form the graded composition gate insulator includes:
growing an $SiO_2$ layer of desired thickness on a single crystalline Si substrate wafer by thermal oxidation in a separate oxidizing system;
cleaning the $SiO_2$ layer via sputter etching using inert gas ions in order to remove carbon, water, and other surface contaminants;
transferring the thermally oxidized $SiO_2$ layer on the substrate wafer to an $SiO_x$ processing system and a temperature of approximately 300 to 500 degrees Celsius;
using a spatial or temporal approach to alternate depositing silicon on the thermally oxidized $SiO_2$ layer using a directed source such as a shielded S-gun or Knudsen cell and for oxidizing the substrate wafer in an oxygen plasma in order to form the $SiO_x$ layer.

27. The method of claim 26, wherein the method further includes forming a portion of the floating gate by depositing polysilicon on the $SiO_x$ layer in order to passivate the surface of the $SiO_x$ layer before removing the substrate wafer from the $SiO_x$, processing system.

28. A method for forming a flash memory cell, comprising:
forming a first source/drain region and a second source/drain region separated by a channel region;
forming a floating gate opposing the channel;
forming a first gate insulator separating the floating gate from the channel, wherein forming the gate insulator includes forming a graded composition gate insulator having a low band gap of approximately 3.2 eV to 3.5 eV and large electron affinity with an approximate range between 0.6 eV and 3.2 eV, and wherein forming the graded composition gate insulator includes forming a dielectric material having a silicon oxycarbide layer in combination with a $SiO_2$ layer to form the graded composition gate insulator, wherein the silicon oxycarbide layer is formed on top of the $SiO_2$ layer under the floating gate and includes sputter-depositing an ultra thin amorphous SiC film on silicon substrate wafer and oxidizing the ultra thin film of amorphous SiC at a temperature of between 25 to 200 degrees Celsius such that the motion of electrically charged reactants is driven by the presence of a field that develops across the ultra thin, growing oxide layer and is based on the electronegativity differences between absorbed surface oxygen and unoxidized material in accord with Mott-Cabrera mechanisms; and forming control gate separated from the floating gate insulator by a second gate insulator.

29. The method of claim 28, wherein an oxide thickness will be approximately 50% thicker than that of the amorphous SiC consumed depending on the composition of the silicon oxycarbide layer formed, and wherein a thickness of the silicon oxycarbide layer formed depends in turn on oxidation process parameters such as whether molecular oxygen or an oxygen plasma is used as a reactive gas.

30. The method of claim 29, wherein a composition and growth rate of the silicon oxycarbide lay is controlled by temperature as well as pressure of oxygen or its plasma.

31. A method for forming a flash memory cell, comprising:

forming a first source/drain region and a second source/drain region separated by a channel region;

forming a floating gate opposing the channel;

forming a first gate insulator separating the floating gate from the channel, wherein forming the gate insulator includes forming a graded composition gate insulator having a low band gap of approximately 3.2 eV to 3.5 eV and large electron affinity with an approximate range between 0.6 eV and 3.2 eV, and wherein forming the graded composition gate insulator includes forming a dielectric material having a silicon oxycarbide layer in combination with a $SiO_2$ layer to form the graded composition gate insulator, which has an electron barrier height ranging from 0.4 eV to 3.2 eV; and forming control gate separated from the floating gate insulator by a second gate insulator.

* * * * *

UNITED STATES PATENT AND TRADEMARK OFFICE
CERTIFICATE OF CORRECTION

PATENT NO. : 6,955,968 B2
APPLICATION NO. : 10/610996
DATED : October 18, 2005
INVENTOR(S) : Forbes et al.

It is certified that error appears in the above-identified patent and that said Letters Patent is hereby corrected as shown below:

On Title page 2, in field (56), under "Other Publications", in column 1, line 1, delete "intrinisic" and insert -- intrinsic --, therefor.

On Title page 2, in field (56), under "Other Publications", in column 1, line 6, delete "silcon" and insert -- silicon --, therefor.

In column 1, line 5, delete "APPLICATIONS(s)" and insert -- APPLICATION(S) --, therefor.

In column 3, line 58, after "device" insert -- . --.

In column 5, line 27, delete "WEEE" and insert -- IEEE --, therefor.

In column 7, line 36, delete "$\Delta V_1 E_1 t_1$;" and insert -- $\Delta V_1 = E_1 t_1$ ; --, therefor.

In column 7, line 37, delete "$\Delta V_2 E_2 t_2$; " and insert -- $\Delta V_2 = E_2 t_2$ ; --, therefor.

In column 8, line 1, delete "a-$Si_xC_{yz}$" and insert -- a-$Si_xC_yO_z$ --, therefor In column 8, line 37, after "1650 C." insert -- , --.

In column 9, line 15, delete "filler" and insert -- fuller --, therefor.

In column 9, line 36, delete "SiO2" and insert -- $SiO_2$ --, therefor.

In column 10, line 21, delete ".coni/" and insert -- .com/ --, therefor.

In column 10, line 50, after "temperature" insert -- , --.

In column 11, line 16, delete "m" and insert -- III --, therefor.

In column 11, line 30, delete "II" and insert -- III --, therefor.

In column 12, line 49, delete "SiOx" and insert -- $SiO_x$ --, therefor.

In column 13, line 30, in Claim 2, delete "SiO2" and insert -- $SiO_2$ --, therefor.

In column 14, line 31, in Claim 12, after "band" delete "a" and insert -- gap --, therefor.

UNITED STATES PATENT AND TRADEMARK OFFICE
CERTIFICATE OF CORRECTION

PATENT NO. : 6,955,968 B2
APPLICATION NO. : 10/610996
DATED : October 18, 2005
INVENTOR(S) : Forbes et al.

It is certified that error appears in the above-identified patent and that said Letters Patent is hereby corrected as shown below:

In column 14, line 41, in Claim 13, after "having" insert -- a --.

In column 15, line 31, in Claim 17, delete "approximate y" and insert -- approximately --, therefor.

In column 15, line 62, in Claim 19, after "from" insert -- a --.

In column 16, line 23, In Claim 23, delete "rotate" and insert -- rotated --, therefor.

In column 16, line 56, in Claim 27, after "$SiO_x$" delete ",".

In column 17, line 16, in Claim 28, after "forming" insert -- a --.

In column 18, line 2, in Claim 30, delete "lay" and insert -- layer --, therefor.

In column 18, line 21, in Claim 31, after "forming" insert -- a --.

Signed and Sealed this

Sixth Day of March, 2007

JON W. DUDAS
*Director of the United States Patent and Trademark Office*